United States Patent
Nam et al.

(10) Patent No.: US 10,295,818 B2
(45) Date of Patent: *May 21, 2019

(54) FLEXIBLE DISPLAY DEVICE

(71) Applicant: Samsung Display Co., Ltd., Yongin (KR)

(72) Inventors: SeungWook Nam, Cheonan-si (KR); Kyu Young Kim, Suwon-si (KR); Ahyoung Kim, Gunpo-si (KR); Gui-Nam Min, Hwaseong-si (KR); Kyu-taek Lee, Cheonan-si (KR); Yong Cheol Jeong, Yongin-si (KR); Soyeon Han, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 163 days.

This patent is subject to a terminal disclaimer.

(21) Appl. No.: 14/223,348

(22) Filed: Mar. 24, 2014

(65) Prior Publication Data

US 2015/0147532 A1 May 28, 2015

(30) Foreign Application Priority Data

Nov. 28, 2013 (KR) ................ 10-2013-0146394

(51) Int. Cl.
| | |
|---|---|
| *B32B 3/30* | (2006.01) |
| *G02B 26/00* | (2006.01) |
| *B32B 7/02* | (2019.01) |
| *B32B 7/12* | (2006.01) |
| *B32B 27/08* | (2006.01) |
| *B32B 27/28* | (2006.01) |

(Continued)

(52) U.S. Cl.
CPC .............. *G02B 26/005* (2013.01); *B32B 3/30* (2013.01); *B32B 7/02* (2013.01); *B32B 7/12* (2013.01);
(Continued)

(58) Field of Classification Search
CPC .. B32B 3/02; B32B 3/26; B32B 3/263; B32B 3/30; B32B 7/02; B32B 7/04; B32B 7/12;
(Continued)

(56) References Cited

U.S. PATENT DOCUMENTS 3,833,703 A * 9/1974 Joos ................ B32B 27/00
 156/231
8,001,711 B2 8/2011 LaFarre et al.
(Continued)

FOREIGN PATENT DOCUMENTS

| | | |
|---|---|---|
| CN | 101441290 | 5/2009 |
| CN | 102496684 | 6/2012 |

(Continued)

*Primary Examiner* — Megha M Gaitonde
(74) *Attorney, Agent, or Firm* — H.C. Park & Associates, PLC

(57) ABSTRACT

A flexible display device includes a flexible display panel and a window member. The flexible display device includes a folding area and a peripheral area disposed adjacent to the folding area. The window member includes at least first and second base layers. The second base layer is overlapped with the first base layer and has a modulus of elasticity that is higher than that of the first base layer. A thickness of a first portion of the first base layer, which is overlapped with the folding area, is greater than a thickness of a second portion of the first base layer, which is overlapped with the peripheral area.

17 Claims, 8 Drawing Sheets

(51) Int. Cl.
*B32B 27/36* (2006.01)
*H01L 51/52* (2006.01)
*G02F 1/167* (2019.01)
*G02F 1/1333* (2006.01)

(52) U.S. Cl.
CPC ............ *B32B 27/08* (2013.01); *B32B 27/281* (2013.01); *B32B 27/36* (2013.01); *H01L 51/524* (2013.01); *B32B 2307/51* (2013.01); *B32B 2307/54* (2013.01); *B32B 2307/546* (2013.01); *B32B 2457/206* (2013.01); *B32B 2457/208* (2013.01); *G02F 1/133305* (2013.01); *G02F 1/167* (2013.01); *H01L 2251/5338* (2013.01); *Y10T 428/24612* (2015.01)

(58) Field of Classification Search
CPC .......... B32B 2457/20; B32B 2457/206; B32B 2457/208; B32B 2307/51; B32B 2307/546; H01L 51/5293; G02B 26/005; G02F 1/167
USPC ......... 428/99, 156, 159, 160, 161, 162, 172, 428/212, 213
See application file for complete search history.

(56) References Cited

U.S. PATENT DOCUMENTS

| | | | |
|---|---|---|---|
| 8,237,165 B2 | 8/2012 | Kim et al. | |
| 9,051,493 B2* | 6/2015 | Bower | ..................... C09J 7/02 |
| 2006/0158861 A1 | 7/2006 | Shouji et al. | |
| 2007/0031642 A1* | 2/2007 | Lee | ............................ B32B 3/00 428/172 |
| 2007/0097014 A1* | 5/2007 | Solomon | ............... G06F 1/1616 345/1.1 |
| 2007/0216639 A1 | 9/2007 | LaFarre et al. | |
| 2009/0126986 A1* | 5/2009 | Kim | ........................ H01J 11/10 174/389 |
| 2010/0148654 A1 | 6/2010 | Yan et al. | |
| 2010/0308335 A1 | 12/2010 | Kim et al. | |
| 2011/0212304 A1* | 9/2011 | Han | ..................... H05B 33/04 428/172 |
| 2013/0002583 A1 | 1/2013 | Jin et al. | |
| 2013/0034685 A1 | 2/2013 | An et al. | |
| 2013/0100053 A1* | 4/2013 | Kang | ....................... G06F 3/03 345/173 |
| 2013/0169515 A1 | 7/2013 | Prushinskiy et al. | |
| 2015/0201487 A1 | 7/2015 | Kee et al. | |

FOREIGN PATENT DOCUMENTS

| | | |
|---|---|---|
| CN | 102855822 | 1/2013 |
| JP | 07-001424 | 1/1995 |
| JP | 2000-122039 | 4/2000 |
| JP | 2005-311171 | 11/2005 |
| JP | 2007-318080 | 12/2007 |
| JP | 2008-500593 | 1/2008 |
| JP | 2009-110780 | 5/2009 |
| JP | 2010-204377 | 9/2010 |
| JP | 2010-282966 | 12/2010 |
| JP | 2013-125118 | 6/2013 |
| KR | 10-2011-0060327 | 6/2011 |

* cited by examiner

FLEXIBLE DISPLAY DEVICE

CROSS-REFERENCE TO RELATED APPLICATION

This U.S. non-provisional patent application claims priority under 35 U.S.C. § 119 of Korean Patent Application No. 10-2013-0146394, filed on Nov. 28, 2013, the contents of which are hereby incorporated by reference in its entirety.

BACKGROUND

Field

The present disclosure relates to a flexible display device. More particularly, the present disclosure relates to a flexible display device capable of reducing defects thereof.

Discussion of the Background

In recent years, a display device (hereinafter, referred to as a flexible display device), which is curved or folded, has been developed. The flexible display device includes a flexible display panel and various functional members.

The functional members are disposed on at least one of two opposing surfaces of the flexible display device. The functional members are curved or folded together with the flexible display panel.

SUMMARY

The present disclosure provides a flexible display device having improved durability and reduced bending stiffness.

Additional features of the invention will be set forth in the description which follows, and in part will be apparent from the description, or may be learned by practice of the invention.

Embodiments of the inventive concept provide a flexible display device including a flexible display panel and a window member. The flexible display panel includes a folding area in which a folding axis is defined and a peripheral area disposed adjacent to the folding area.

The window member is disposed on a surface of the flexible display panel to overlap with the folding area and the peripheral area.

The window member includes a plurality of base layers stacked one on another. The base layers include a first base layer and a second base layer. The second base layer is overlapped with the first base layer and has a modulus of elasticity smaller than a modulus of elasticity of the first base layer. A thickness of a first portion of the second base layer, which is overlapped with the folding area, is greater than a thickness of a second portion of the second base layer, which is overlapped with the peripheral area.

The ratio of the thickness of the first portion of the second base layer to the thickness of the window member is greater than a ratio of the second portion of the second base layer to the thickness of the window member. The ratio of the base layer having the relatively small modulus of elasticity in the folding area of the window member is higher than the ratio of the base layer having the relatively small modulus of elasticity in the peripheral area, and thus, the flexible display device is more easily folded in the folding area.

Due to the first base layer having the modulus of elasticity greater than that of the second base layer, the strength of the window member is enhanced. That is, since the first base layer serves as the outer surface of the window member, the external strength of the flexible display device is enhanced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION

Figure 1A:
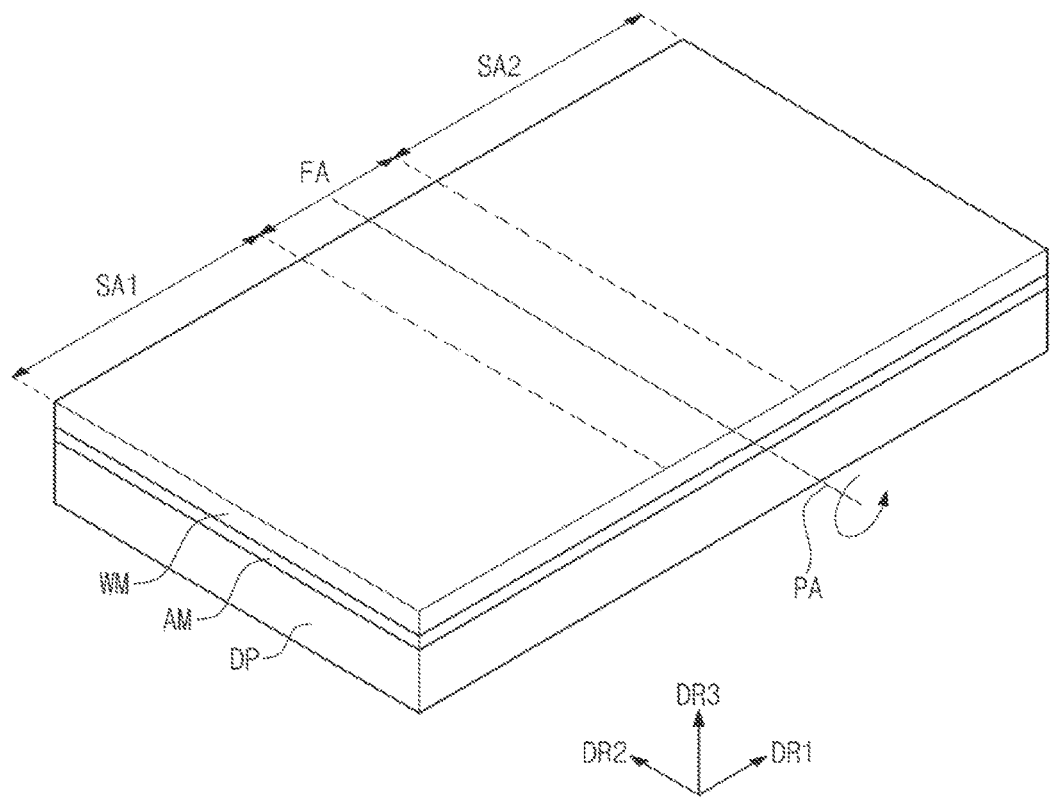
FIG. 1A is a perspective view showing a flexible display device in a stretched out configuration, according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
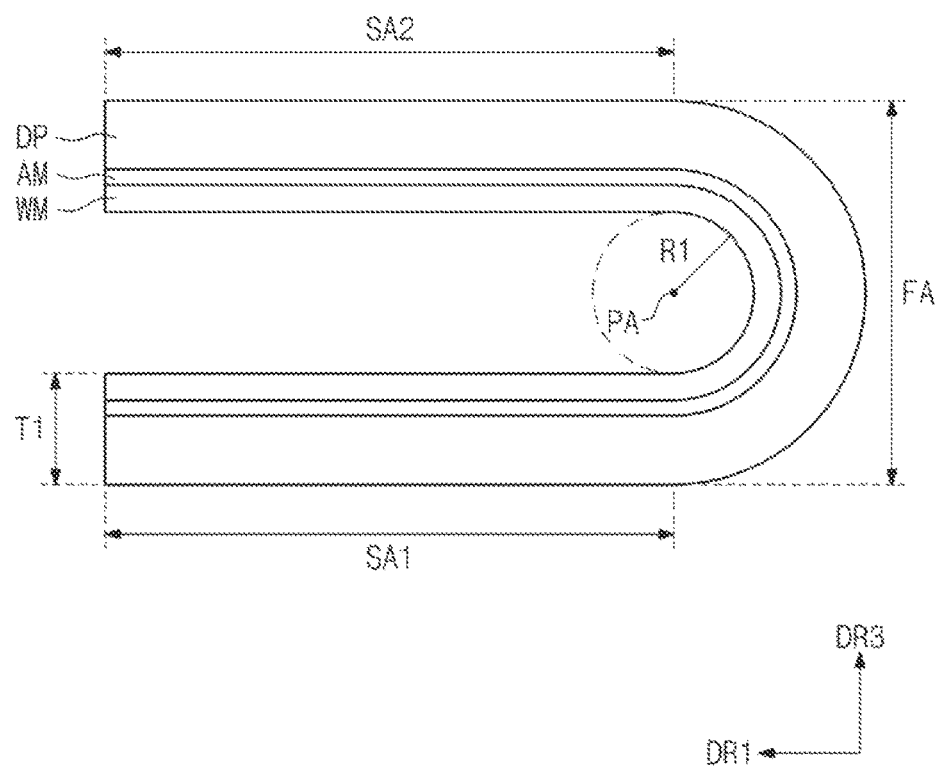
FIG. 1B is a side view showing a flexible display device in a folded configuration, according to an exemplary embodiment of the present disclosure.

FIG. 1A is a perspective view showing a flexible display device stretched out according to an exemplary embodiment of the present disclosure, and FIG. 1B is a side view showing a flexible display device folded according to an exemplary embodiment of the present disclosure. Referring to FIGS. 1A and 1B, the flexible display device (hereinafter, referred to as a display device) includes a flexible display panel DP (hereinafter, referred to as a display panel) and a flexible window member WM (hereinafter, referred to as a window member) disposed on one surface of the display panel DP.

The display panel DP and the window member WM are attached to each other by a transparent adhesive member AM. The adhesive member AM may be, but not limited to, a pressure sensitive adhesive (PSA) that is cured by ultraviolet light. The display panel DP and the window member WM may not be directly attached to each other. That is, other functional members may be disposed between the display panel DP and the window member WM.

The display device may be curved or wrapped to have a curved surface, or folded in a specific area thereof. The display device includes a folding area FA and peripheral areas SA1 and SA2 in a plane defined by a first direction DR1 and a second direction DR2. FIGS. 1A and 1B show the display device including one folding area FA and two peripheral areas SA1 and SA2.

The folding area FA corresponds to an area in which the display device is folded. The display device is folded along a folding axis FA defined in the folding area FA. The folding axis FA is an imaginary line extending in the second direction DR2. The peripheral areas SA1 and SA2 are disposed adjacent to the folding area FA. The peripheral areas SA1 and SA2 are flat or slightly curved. The folding area FA and the peripheral areas SA1 and SA2 are applied to the display panel DP and the window member WM.

The display panel DP includes a flexible base substrate, signal lines disposed on the base substrate, and pixels electrically connected to the signal lines. The pixels generate an image on the basis of signals provided through the signal lines. The display panel DP displays the image on a surface thereof. The display panel DP may be an organic light emitting display panel, an electrophoretic display panel, or an electrowetting display panel.

The pixels are disposed in the folding area FA and the peripheral areas SA1 and SA2 of the display panel DP. The image displayed through the folding area FA and the peripheral areas SA1 and SA2 of the display device may provide image information corresponding to one image.

The window member WM protects the display panel DP. The window member WM is formed of a transparent material. Although not shown in figures, the window member WM includes a plurality of base layers. The base layers are attached to each other by an adhesive layer disposed therebetween.

As shown in FIG. 1B, the display device may be folded to allow the two peripheral areas SA1 and SA2 to face each other. The display device has a radius of curvature R1 of about 0.5 mm to about 10 mm, but the present invention is not be limited thereto. The display device may be folded such that an angle between the two peripheral surfaces SA1 and SA2 is about 10 degrees to about 90 degrees.

The display device has a thickness T1 equal to a sum of the thicknesses of the display panel DP, the window member WM, and the adhesive member AM in a normal line direction DR3 with respect to the plane surface defined by the first direction DR1 and the second direction DR2. As the thickness T1 of the display device increases, a strain occurring in the display device increases.

Figure 2A:
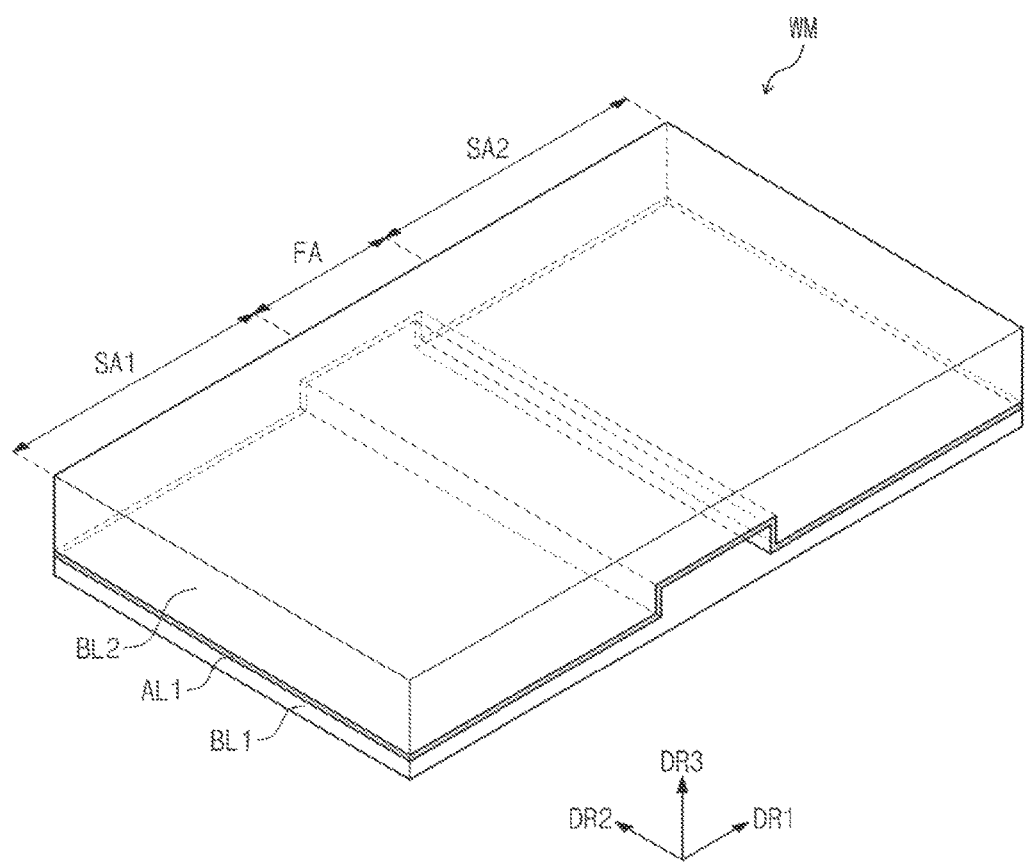
FIG. 2A is a perspective view showing a window member in a stretched out configuration, according to an exemplary embodiment of the present disclosure.
Figure 2B:
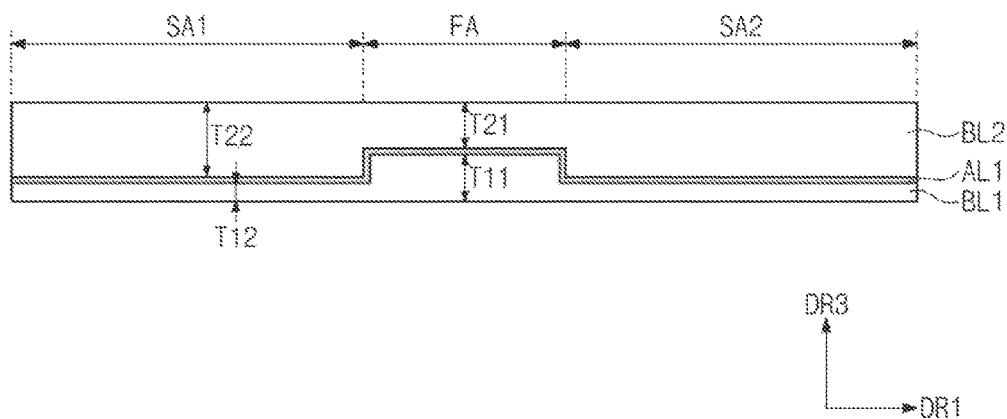
FIG. 2B is a side view showing a window member in a stretched out configuration, according to an exemplary embodiment of the present disclosure.

FIG. 2A is a perspective view showing a window member in a stretched out configuration, according to an exemplary embodiment of the present disclosure, and FIG. 2B is a side view showing a window member in a stretched out configuration, according to an exemplary embodiment of the present disclosure. FIGS. 2A and 2B show the window member WM including a first base layer BL1 and a second base layer BL2, but the structure of the window member WM is not be limited thereto. Each of the first and second base layers BL1 and BL2 may include a plastic film. The first and second base layers BL1 and BL2 may be plastic films having different moduli of elasticity from each other.

The first base layer BL1 and the second base layer BL2 are attached to each other by an adhesive layer AL1. The adhesive layer AL1 includes at least one of an acrylic-based resin and a silicon-based resin.

To this end, the first and second base layers BL1 and BL2 are pressurized to each other after a liquefied resin is coated on the first base layer BL1 or the second base layer BL2. Then, the liquefied resin is cured to form the adhesive layer AL1. The first and second base layers BL1 and BL2, which have different thicknesses according to areas thereof, may be manufactured by dry etching or a laser etching a plastic film.

When the window member WM is disposed on the display panel DP (refer to FIGS. 1A and 1B), the first base layer BL1 is disposed closer to the display panel DP than the second base layer BL2. That is, the first base layer BL1 is disposed under the second base layer BL2, when viewed in the normal line direction DR3.

The first base layer BL1 has a smaller modulus of elasticity than that of the second base layer BL2. A thickness T11 of a first portion of the first base layer BL1, which is overlapped with the folding area FA, is greater than a thickness T12 of a second portion of the first base layer BL1, which is overlapped with the peripheral areas SA1 and SA2. In the present exemplary embodiment, the thicknesses T11 and T12 are average values.

A width in the first direction DR1 of the first portion of the first base layer BL1 may be equal to a width in the second direction DR2 of the folding area FA. The first portion of the first base layer BL1 has a uniform thickness T11. According to another exemplary embodiment of the present disclosure, a ratio of the width in the first direction DR1 of the first portion of the first base layer BL1 to the width in the second direction DR2 of the folding area FA may be changed.

The first portion of the window member WM, which is overlapped with the folding area FA, has a smaller modulus of elasticity than that of the second portion of the window member WM, which is overlapped with the peripheral areas SA1 and SA2. This is because a thickness ratio of the first base layer BL1 having the smaller modulus of elasticity in the first portion of the window member WM is relatively greater than that of the first base layer BL1 in the second portion of the window member WM, in consideration of the thickness of the window member WM. The thickness of the window member WM is equal to a sum of the thickness of the first base layer BL1, the thickness of the second base layer BL2, and the thickness of the adhesive layer AL1.

The window member WM according to the present exemplary embodiment is more easily folded in the folding area FA than a single-layered window member (hereinafter, referred to as a first sample window member) having the same thickness as that of the window member WM and including the same material as that of the second base layer BL2. In other words, the window member WM according to the present exemplary embodiment has a smaller bending stiffness than that of the first sample window member.

The window member WM according to the present exemplary embodiment has the bending stiffness greater than that of a single-layered window member (hereinafter, referred to as a second sample window member) having the same thickness as that of the window member WM and including the same material as that of the first base layer BL1. This is because the bending stiffness of the window member WM is compensated by the second base layer BL2 having a relatively large modulus of elasticity.

A thickness T21 of the first portion of the second base layer BL2, which is overlapped with the folding area FA, is smaller than a thickness T22 of the second portion of the second base layer BL2, which is overlapped with the peripheral areas SA1 and SA2. In the present exemplary embodiment, the thicknesses T21 and T22 are average values.

The thickness of the first portion of the window member WM, which is overlapped with the folding area FA, is substantially the same as the thickness of the second portion of the window member WM, which is overlapped with the peripheral areas SA1 and SA2. The first portion of the first base layer BL1, which is overlapped with the folding area FA, is engaged with the first portion of the second base layer BL2, which is overlapped with the folding area FA.

The window member WM, according to the present exemplary embodiment, is more easily folded than a window member (hereinafter, referred to as a third sample window member) including two base layers each having a constant thickness, regardless of positions thereof in the folding area FA, and has a bending stiffness similar to that of the third sample window member in the peripheral areas SA1 and SA2. In this case, the window member WM and the third sample window member have the same thickness.

The first portion of the window member WM and the second portion of the window member WM have substantially the same thickness. The thickness of the window member WM is in a range from about 20 micrometers to about 300 micrometers. The window member WM should have at least a predetermined strength, in order to protect the display panel DP from external impacts. To this end, the window member WM has the thickness greater than about 20 micrometers. To reduce the strain proportional to the thickness, the thickness of the window member WM is smaller than about 300 micrometers. The thickness of the window member WM may be in the range of about 20 micrometers to about 300 micrometers, according to materials used to form the first and second base layers BL1 and BL2.

The thickness T11 of the first portion of the first base layer BL1 corresponds to about 80 percent to about 120 percent of the thickness T21 of the first portion of the second base layer BL2. This is to allow the window member WM to be easily folded in the folding area FA and to maintain a predetermined strength.

The thickness T12 of the second portion of the first base layer BL1 corresponds to about 2 percent to about 20 percent of the thickness T22 of the second portion of the second base layer BL2. This is to maintain the strength of the peripheral areas SA1 and SA2 of the window member WM to be higher than that of the folding area FA of the window member WM.

Figure 3:
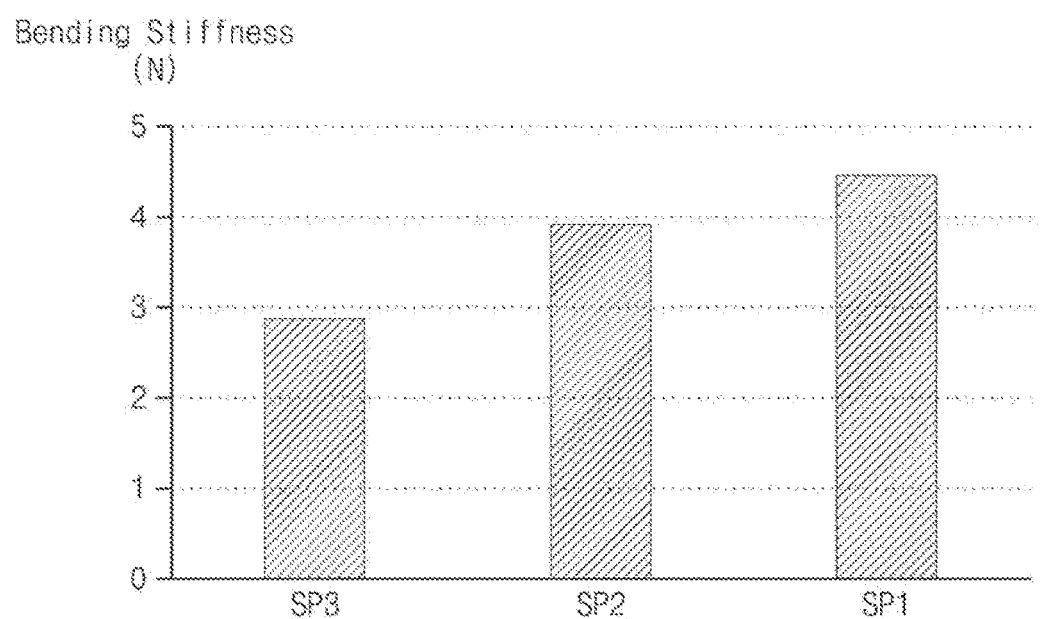
FIG. 3 is a graph showing a bending stiffness with respect to the structures of window members.

FIG. 3 is a graph showing a bending stiffness to a structure of window members. First to third bars SP1, SP2, and SP3 shown in FIG. 3 represent the bending stiffness of the window members each having a thickness of about 200 micrometers.

The first bar SP1 represents the bending stiffness of the single-layered window member including a polyimide film layer having the thickness of about 200 micrometers. According to the first bar SP1, the bending stiffness is about 4.5 Newtons.

Each of the second and third bars SP2 and SP3 represents the bending stiffness of the double-layered window members including a polyimide film having a thickness of about 100 micrometers and a polyethylene terephthalate film layer having a thickness of about 100 micrometers.

The polyimide film layer has the smaller modulus of elasticity than that of the polyethylene terephthalate film layer. The polyimide film layer has a tensile modulus of about 3.2 and the polyethylene terephthalate film layer has a tensile modulus of about 5.1.

The polyethylene terephthalate film layer of the window member having the bending stiffness represented by the second bar SP2 is disposed closer to the display panel DP (refer to FIGS. 1A and 1B) than the polyimide film of the window member having the bending stiffness represented by the second bar SP2. The polyimide film of the window member having the bending stiffness represented by the third bar SP3 is disposed closer to the display panel DP (refer to FIGS. 1A and 1B) than the polyethylene terephthalate film layer of the window member having the bending stiffness represented by the third graph SP3.

According to the second bar SP2, the bending stiffness is about 3.9 Newtons, and the bending stiffness is about 2.9 Newtons according to the third bar SP3. As represented by the first, second, and third bars SP1, SP2, and SP3, the window members including the base layers having different moduli of elasticity have less bending stiffness smaller than that of the single-layered window member. In addition, when the base layer having the relatively small modulus of elasticity is disposed closer to to the display panel than the base layer having the relatively larger modulus of elasticity, the bending stiffness is reduced, and the base layer having the relatively larger modulus of elasticity serves as an outer surface of the window member. Therefore, the outer strength of the flexible display device is increased.

Figure 4A:
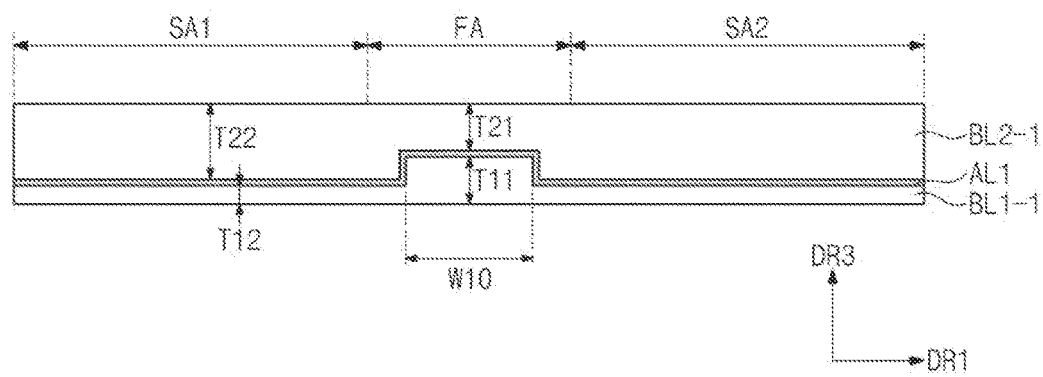
FIGS. 4A, 4B, 4C, and 4D are side views showing window members according to exemplary embodiments of the present disclosure.

FIGS. 4A to 4D are side views showing window members according to exemplary embodiments of the present disclosure. In FIGS. 4A to 4D, the same reference numerals denote the same elements in FIGS. 1 to 3, and thus detailed descriptions of the same elements will be omitted. Referring to FIG. 4A, a width W10 in the first direction DR1 of a first portion of a first base layer BL1-1 may be smaller than a width in the first direction DR1 of the folding area FA.

When the window member WM is folded, a compression stress is concentrated at a center position of the folding area FA in the first direction DR1. Although the width W10 of the first portion of the first base layer BL1-1 is smaller than that of the folding area FA in the first direction DR1, the compression stress applied to the window member WM is reduced when the first portion of the first base layer BL1-1 is overlapped with the center position of the folding area FA.

Figure 4B:
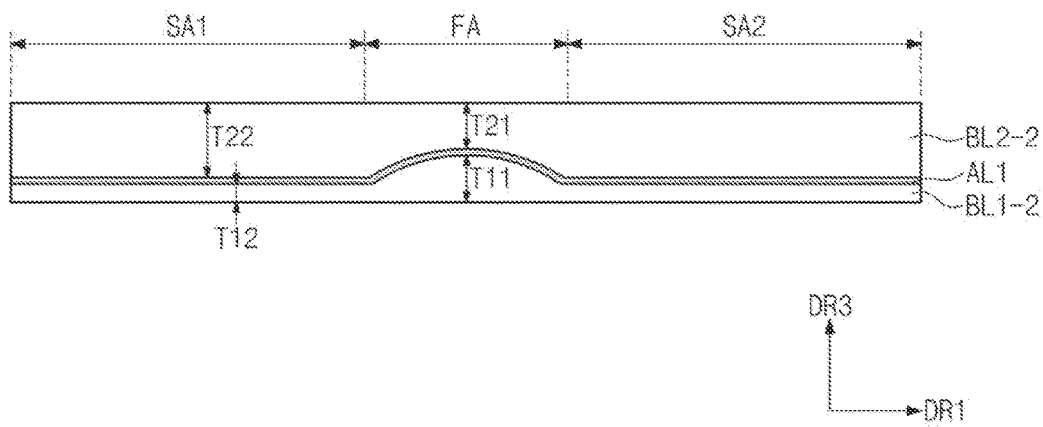
Figure 4C:
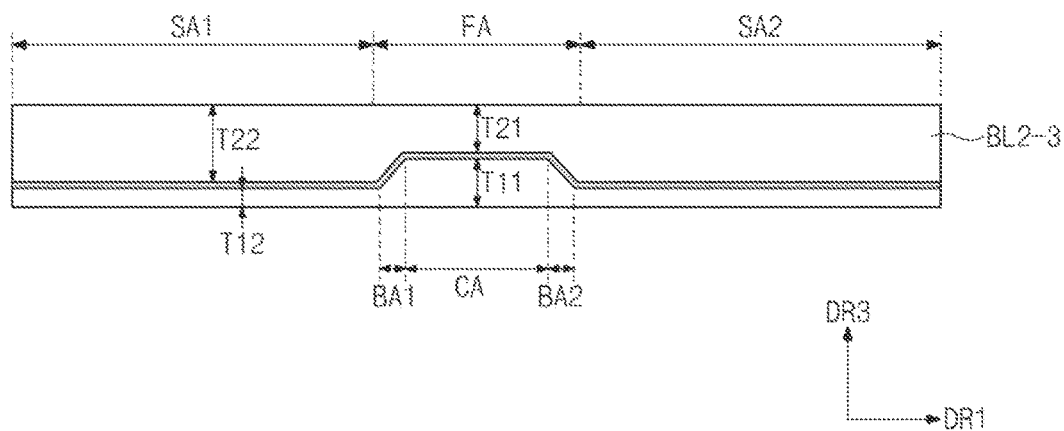

Referring to FIGS. 4B and 4C, the first portions of the first base layers BL1-2 and BL1-3, which are overlapped with the folding area FA, may have a thickness T11, which is not uniform. As shown in FIG. 4B, the first portion of the first base layer BL1-2 has a peak in a cross section taken along the first direction DR1 (i.e., the first base layer BL1-2 has a curved protrusion). The first portion of the first base layer BL1-2 has a boundary surface that makes contact with the adhesive layer AL1.

The boundary surface has a convex boundary line in the first portion of the first base layer BL1-2 when viewed in the cross section taken along the first direction DR1. According to another exemplary embodiment of the present disclosure, the boundary surface may have a different shaped boundary line with the peak in the first portion of the first base layer BL1-2, when viewed in the cross section taken along the first direction DR1.

The thickness T11 of the first portion of the first base layer BL1-2 corresponds to about 80 percent to about 120 percent of the thickness T21 of the first portion of the second base layer BL2-2. In the present exemplary embodiment, the thickness T11 of the first portion of the first base layer BL1-2 corresponds to a maximum value measured at the peak and the thickness T21 of the first portion of the second base layer BL2-2 corresponds to a minimum value.

According to the present exemplary embodiment, although a light is applied to the window member WM, the boundary between the first portion of the first base layer BL1-2 and the second portion of the first base layer BL1-2 is not optically apparent. This is because the thickness T11 of the first portion of the first base layer BL1-2 is gradually changed along the first direction DR1.

As shown in FIG. 4C, the first portion of the first base layer BL1-3 is divided into a center portion CA and boundary portions BA1 and BA2, each having a thickness different from that of the center portion CA. The thickness T11 of the first portion of the first base layer BL1-3 corresponds to about 80 percent to about 120 percent of the thickness T21 of the first portion of the second base layer BL2-3. In the present exemplary embodiment, the thickness T11 of the first portion of the first base layer BL1-3 is measured at the center portion CA, and the thickness T21 of the first portion of the second base layer BL2-3 is measured at a portion of the second base layer BL2-3 corresponding to the center portion CA.

Figure 4D:
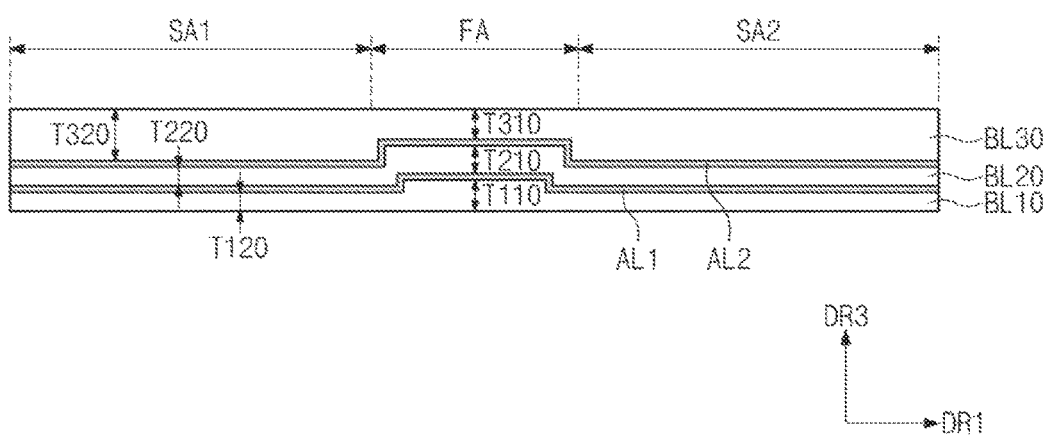

Referring to FIG. 4D, the window member WM includes base layers BL10, BL20, and BL30. Adhesive layers AL1 and AL2 are disposed between the base layers BL10, BL20, and BL30 to attach the base layers BL10, BL20, and BL30 to each other. As shown in FIG. 4D, the window member WM may include three base layers, e.g., a first base layer BL10, a second base layer BL20, and a third base layer BL30.

The first and second base layers BL10 and BL20 have a modulus smaller than a modulus of the third base layer BL30. Among the first, second, and third base layers BL10, BL20, and BL30, the first base layer BL10 having smallest modulus is disposed more adjacent to the one surface of the display panel DP (refer to FIGS. 1A and 1B) than the second and third base layers BL20 and BL30.

Among the first, second, and third base layers BL10, BL20, and BL30, the third base layer BL30 having largest modulus of elasticity is disposed further from the one surface of the display panel DP than the first and second base layers BL10 and BL20. The third base layer BL30 having a relatively higher strength serves as an outer surface of the display device.

The thicknesses T110 and T210 of the first portions of the first and second base layers BL10 and BL20, which are overlapped with the folding area FA, are larger than the thicknesses T120 and T220 of the second portions of the first and second base layers BL10 and BL20, which are overlapped with the peripheral areas SA1 and SA2.

The thickness T310 of the first portion of the third base layer BL30 overlapped with the folding area FA is smaller than the thickness T320 of the second portions of the third base layer BL30 overlapped with the peripheral areas SA1 and SA2.

The thicknesses T110 and T210 of the first portions of the first and second base layers BL10 and BL20 correspond to about 80 percent to about 120 percent of the thickness T310 of the first portion of the third base layer BL30. This is to allow the window member WM to be easily folded in the folding area FA and to maintain a predetermined strength.

In addition, the thickness T110 of the first portion of the first base layer BL10 is larger than the thickness T210 of the first portion of the second base layer BL20. This is to allow the window member WM to be more easily folded in the folding area FA.

The thicknesses T120 and T220 of the second portions of the first and second base layers BL10 and BL20 correspond to about 2 percent to about 20 percent of the thickness T320 of the second portion of the third base layer BL30. Thus, the strength in the peripheral areas SA1 and SA2 of the window member WM is maintained at a higher level than the strength in the folding area FA of the window member. According to some embodiments, the structures of the folding areas FA shown in FIGS. 4B and 4C can be applied to the folding area FA of FIG. 4D.

Figure 5:
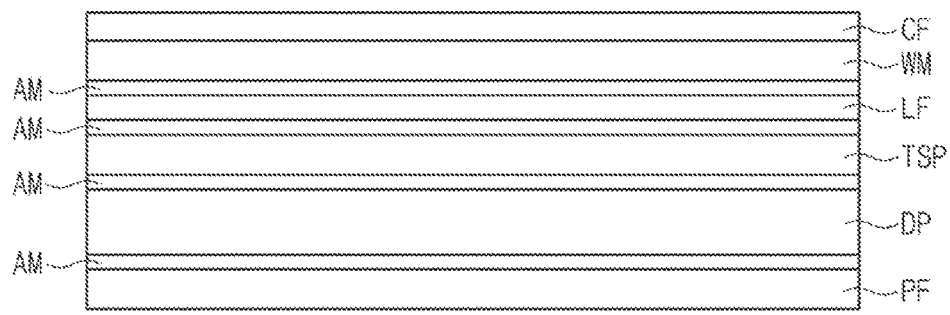
FIG. 5 is a cross-sectional view showing a flexible display device according to an exemplary embodiment of the present disclosure.

FIG. 5 is a cross-sectional view showing a flexible display device according to an exemplary embodiment of the present disclosure. The flexible display device (hereinafter, referred to as a display device) includes a flexible display panel DP (hereinafter, referred to as a display panel), a flexible window member WM (hereinafter, referred to as a window member) disposed on one surface of the display panel DP, and functional members.

The functional members include a touch screen TSP and an optical member LF, which are disposed between the display panel DP and the window member WM. The touch screen TSP senses an external input and is attached to the display panel DP by an adhesive member AM.

The optical member LF is attached to the touch screen TSP by an adhesive member AM. The optical member LF includes at least a polarizing plate. In addition, the optical member LF may further include a retardation plate. The optical member LF may prevent external light from being reflected. The optical member LF may be omitted or included in the touch screen TSP.

A functional coating layer FC may be disposed on the outer surface of the window member WM. The functional coating layer FC may include at least one of an anti-fingerprint coating layer, an anti-reflection coating layer, an anti-glare coating layer, and a hard coating layer.

The functional members may further include a protective film PF disposed on the other outer surface of the window member WM. The protective film PF protects the display panel from external impacts. The protective film PF is attached to the display panel DP by an adhesive member AM.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A flexible display device, comprising:
    a flexible display panel that comprises a folding area in which a folding axis is defined and a peripheral area disposed on opposing sides of the folding area; and
    a window member overlapping the folding area and the peripheral area, the window member comprising:
        a first base layer having a first modulus of elasticity disposed on a surface of the flexible display panel; and
        a second base layer disposed on the first base layer in a direction in which the first base layer is disposed on the surface of the flexible display panel and having a second modulus of elasticity that is higher than the first modulus of elasticity,
    wherein the first base layer has a first portion that overlaps the folding area, and a second portion that overlaps the peripheral area, the first portion of the first base layer is thicker than the second portion of the first base layer,
    wherein the first base layer is continuous within the folding area and the peripheral area,
    wherein the second base layer has a first portion that overlaps the folding area, and a second portion that overlaps the peripheral area, the first portion of the second base layer being thinner than the second portion of the second base layer,
    wherein the window member comprises a transparent material,
    wherein the first base layer is disposed closer to the flexible display panel than the second base layer,
    wherein the first base layer and the second base layer are flat in the peripheral area and have uniform thicknesses in the peripheral area, and
    wherein a minimum thickness of the first base layer is less than a minimum thickness of the second base layer.

2. The flexible display device of claim 1, wherein the window member has a substantially constant thickness within the folding area and the peripheral area.

3. The flexible display device of claim 2, wherein the thickness of the window member is in a range of about 20 micrometers to about 300 micrometers.

4. The flexible display device of claim 1, wherein:
    a first portion of the second base layer overlaps the folding area; and
    the thickness of the first portion of the first base layer is about 80% to about 120% of the thickness of the first portion of the second base layer.

5. The flexible display device of claim 4, wherein:
    a second portion of the second base layer overlaps the peripheral area; and
    the thickness of the second portion of the first base layer is about 2% to about 20% of the thickness of the second portion of the second base layer.

6. The flexible display device of claim 5, wherein the first base layer is disposed closer to the flexible display panel than the second base layer.

7. The flexible display device of claim 1, wherein a width of the first portion of the first base layer, taken in a direction substantially perpendicular to the folding axis, is equal to or smaller than a width of the folding area, taken in the direction substantially perpendicular to the folding axis.

8. The flexible display device of claim 7, wherein the first portion of the first base layer has a uniform thickness.

9. The flexible display device of claim 7, wherein the first portion of the first base layer has a curved cross section taken along the direction substantially perpendicular to the folding axis.

10. The flexible display device of claim 7, wherein the first portion of the first base layer comprises a protrusion having a trapezoidal cross section, taken in the direction substantially perpendicular to the folding axis.

11. The flexible display device of claim 1, wherein the window member further comprises an adhesive layer attaching the first base layer and the second base layer, and wherein the adhesive layer comprises at least one of an acrylic based resin and a silicon based resin.

12. The flexible display device of claim 1, further comprising a touch screen and a polarizing plate, disposed between the flexible display panel and the window member.

13. The flexible display device of claim 1, wherein the window member further comprises a third base layer attached to the first base layer or the second base layer, the third base layer having a modulus of elasticity different from the modulus of elasticity of the first base layer.

14. A flexible display device, comprising:
    a flexible display panel that comprises a folding area in which a folding axis is defined and a peripheral area disposed on opposing sides of the folding area; and
    a window member overlapping the folding area and the peripheral area, and comprising a first base layer disposed on a surface of the flexible display panel, a second base layer disposed on the first base layer in a direction in which the first base layer is disposed on the flexible display panel, and a third base layer disposed on the second base layer in a direction in which the second base layer is disposed on the first base layer,
    wherein the first base layer has the lowest modulus of elasticity among the base layers, has a first portion that overlaps the folding area, and has a second portion that overlaps the peripheral area, the first portion of the first base layer is thicker than the second portion of the first base layer,
    wherein the first base layer is continuous within the folding area and the peripheral area,
    wherein the third base layer has the highest modulus of elasticity among the base layers, has a first portion that overlaps the folding area, and has a second portion that overlaps the peripheral area, the first portion of the third layer being thinner than the second portion of the third base layer,
    wherein a border between the first portion of the second base layer and the first portion of the third base layer is planar,
    wherein the window member comprises a transparent material, and wherein the first base layer and the second base layer are flat in the peripheral area and have uniform thicknesses in the peripheral area.

15. The flexible display device of claim 14, wherein the first base layer is disposed closer to the flexible display panel than the second and third base layers.

16. The flexible display device of claim 15, wherein the third base layer is disposed further from the display panel than the first and second base layers.

17. The flexible display device of claim 16, wherein:
the second base layer has a first portion that overlaps the folding area, and has a second portion that overlaps the peripheral area;
the thickness of the first portion of the second base layer is greater than the thickness of the second portion of the third base layer; and
the second base layer is disposed between the first base layer and the third base layer.

\* \* \* \* \*